(12) United States Patent
Nakano et al.

(10) Patent No.: US 7,209,367 B2
(45) Date of Patent: Apr. 24, 2007

(54) ELECTRONIC APPARATUS AND METHOD FOR MANUFACTURING THE SAME

(75) Inventors: Tetsuo Nakano, Toyoake (JP); Yukihiro Maeda, Kasugai (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/402,881

(22) Filed: Apr. 13, 2006

(65) Prior Publication Data

US 2006/0234528 A1    Oct. 19, 2006

(30) Foreign Application Priority Data

Apr. 13, 2005    (JP) .............................. 2005-115625

(51) Int. Cl.
*H05K 1/11*    (2006.01)
*H05K 1/14*    (2006.01)

(52) U.S. Cl. ...................................... 361/803; 361/775

(58) Field of Classification Search ........ 361/775–777, 361/803; 439/76.1, 76.2; 257/690–692
See application file for complete search history.

(56) References Cited

U.S. PATENT DOCUMENTS

| 5,408,383 A | 4/1995 | Nagasaka et al. |
| 5,586,388 A | 12/1996 | Hirao et al. |
| 5,586,389 A | 12/1996 | Hirao et al. |
| 5,646,827 A | 7/1997 | Hirao et al. |
| 5,657,203 A * | 8/1997 | Hirao et al. ................ 361/707 |
| 5,699,233 A * | 12/1997 | Zlamal ....................... 361/759 |
| 6,060,772 A * | 5/2000 | Sugawara et al. .......... 257/678 |
| 6,421,244 B1 * | 7/2002 | Shinohara et al. .......... 361/736 |
| 6,914,321 B2 * | 7/2005 | Shinohara ................... 257/678 |

FOREIGN PATENT DOCUMENTS

| JP | A-07-029647 | 1/1995 |
| JP | A-08-102574 | 4/1996 |
| JP | A-08-192665 | 7/1996 |
| JP | A-08-306858 | 11/1996 |

* cited by examiner

*Primary Examiner*—Tuan Dinh
(74) *Attorney, Agent, or Firm*—Posz Law Group, PLC

(57) ABSTRACT

An electronic apparatus has a wiring board and connector units which are mounted at a case unit. The connector unit has an external connection surface connected with the external and a terminal installation surface, which is substantially flat and positioned at an opposite side to the external connection surface. A terminal of the connector unit is electrically connected with a pad positioned at a first surface of the wiring board via a connection member. The wiring board and the connector unit which are integrated are mounted at the case unit, with the first surface and the terminal installation surface facing the case unit. The case unit has an installation surface at which a recess for accommodating therein the connection member is arranged.

14 Claims, 4 Drawing Sheets

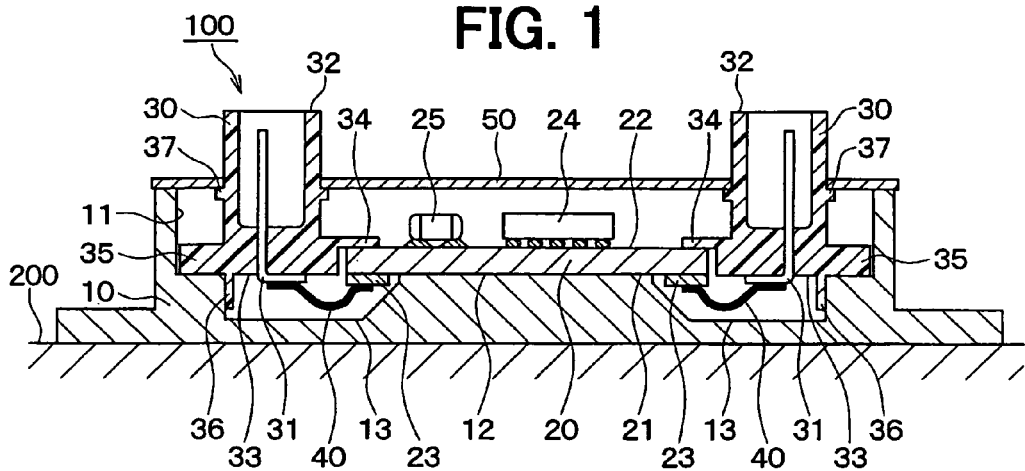
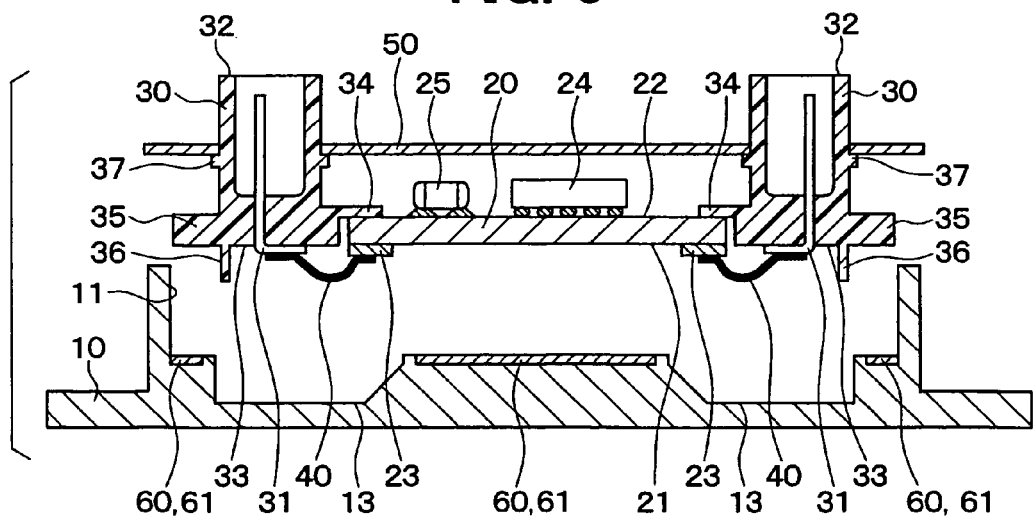

ELECTRONIC APPARATUS AND METHOD FOR MANUFACTURING THE SAME

CROSS REFERENCE TO RELATED APPLICATION

This application is based on a Japanese Patent Application No. 2005-115625 filed on Apr. 13, 2005, the disclosure of which is incorporated herein by reference.

FIELD OF THE INVENTION

The present invention relates to an electronic apparatus and a method for manufacturing the same, in which a wiring board and a connector unit for an external connection are electrically connected with each other via a connection member and mounted at a case unit.

BACKGROUND OF THE INVENTION

Generally, an electronic apparatus is provided with a wiring board, connector units (for external connection) arranged at the periphery of the wiring board, connection members for electrically connecting the wiring board with the connector units, and a case unit at which the wiring board and the connector units are mounted.

Recently, it is preferable for the wiring board to be miniaturized, that is, a connection space for the connection between the wiring board and the connector unit to be reduced, in order to small-size (high-density package) the electronic apparatus.

In the conventional electronic apparatus, the wiring board and the connector unit are connected with each other through the connection member such as a bonding wire, after the wiring board and the connector unit are mounted at the case unit.

However, if the connection space for the connection between the wiring board and the connector units is narrowed, a connection device and a connection jig will interfere with components adjacent thereto when performing the connection operation. Therefore, it is difficult to small-size and high-density package the electronic apparatus.

The interference in the connection via the connection member will be described with reference to FIGS. 7 and 8.

As shown in FIG. 7, an electronic apparatus as a first comparison example is provided with a case unit 10 having an opening portion 11, whose bottom surface functions as a mounting surface 12. A wiring board 20 and connector units 30 for an external connection are mounted at the mounting surface 12. A surface 11a of the edge of the opening portion 11 is a mounting surface, through which the electronic apparatus is attached to an attachment member (not shown).

Electronic components 24, 25, and pads 23 connected with a bonding wire 40 (as connection member) are mounted at the wiring board 20. The connector units 30 are arranged at the periphery of the wiring board 20.

The connector unit 30 of the side of an external connection surface 32 is connected with an external wiring member such as wire harness. The connector unit 30 made of resin is provided with a terminal 31 which is connected with the bonding wire 40 and constructed by insert-molding.

In the connector unit 30, a surface opposite to the external connection surface 32 functions as a terminal installation surface 33 on which the terminal 31 is provided. The terminal 31 and the pad 23 of the wiring board 20 are electrically connected with each other via the bonding wire 40.

In this case, as shown in FIG. 7, both the pad 23 of the wiring board 20 and the terminal 31 of the connector unit 30 are arranged at an opposite side of the wiring board 20 to the mounting surface 12 of the case unit 10. That is, the pad 23 and the terminal 31 do not face the mounting surface 12 of the case unit 10. In this state, the wiring board 20 and the connector units 30 are mounted at the mounting surface 12 of the case unit 10, and thereafter the connection via the bonding wire 40, that is, the wire bonding is performed.

However, in this case, a bonder 300 of a wire bonding device interferes with a sidewall of the case unit 10, so that the wire bonding becomes difficult.

In the case with reference to FIG. 7, after performing the fist bonding at the pad 23 of the wiring board 20, the second bonding is performed at the terminal 31 of the connector unit 30. Thereafter, when the bonder 300 is made step back in order to cut the wire 40, the bonder 300 will interfere with the sidewall of the case unit 10.

In order to prevent the interference, it is necessary to enlarge a distance L1 between the terminal 31 and the case unit 10 to widen a connection space. As a result, the electronic apparatus becomes large. Therefore, it is difficult to small-size the electronic apparatus in this case.

On the other hand, even when the first bonding is performed at the side of the terminal 31, the interference of the bonder 300 similarly to what is described above will occur in the case where the distance L1 between the terminal 31 and the case unit 10 is small.

Referring to FIG. 8, an electronic apparatus as a second comparison example has a case unit 10 with a substantial flat-plate shape. A first surface of the case unit 10 is used as a mounting surface 12. A wiring board 20 and connector units 30 are mounted at the mounting surface 12. The case unit 10 has a second surface (at opposite side to mounting surface 12), at which the electronic apparatus is attached to an attachment member (not shown).

Similarly to the case of FIG. 7, electronic components 24, 25 and pads 23 are arranged on the wiring board 20. Moreover, the connector units 30 are arranged at the periphery of the wiring board 20.

Referring to FIG. 8, both an external connection surface 32 and a terminal installation surface 33 of the connector unit 30 are positioned at the side (of connector unit 30) opposite to the mounting surface 12 of the case unit 10. That is, the external connection surface 32 and the terminal installation surface 33 do not face the mounting surface 12. Therefore, a part (in vicinity of terminal 31) of the connector unit 30 of the side of the external connection surface 32 will interfere with the bonder 300. That is, an interference between the bonder 300 of the wire bonding device and the connector unit 30 is caused, so that the wire bonding becomes difficult.

In this case, after the first bonding is performed at the terminal 31 of the connector unit 30, the second bonding is performed at the pad 23 of the wiring board 20. In performing the first bonding, the bonder 300 interferes with the connector unit 30.

In order to prevent the interference, it is necessary to enlarge a distance L2 between the terminal 31 and the external connection surface 32 of the connector unit 30 to widen a connection space. Thus, the size of the electronic apparatus becomes large, so that the miniaturization thereof becomes difficult. The interference occurs similarly in the case where the first bonding is performed at the side of the pad 23 in FIG. 8.

As described above, in the electronic apparatuses shown in FIG. 7 and FIG. 8, the interference of the bonding device is caused in the wire bonding. The electronic apparatus will become large, if the distance between the bonding device and the interfering element such as the case unit and the connector unit is enlarged in order to ensure a sufficient connection space.

The above-described problem is not only caused in the case where the connection between the wiring board and the connector unit is established via the wire bonding, but also caused in the case where a flexible printed circuit board is used as the connection member. In this case, a pressing/ heating jig for the connection interferes with the above-described interfering elements.

Therefore, according to the conventional electronic apparatus (referring to first and second comparison examples), there exits a trade-off relationship between realization of a sufficient connection space and realization of a miniaturization of the electronic apparatus, so that it is difficult to satisfy these requirements simultaneously.

SUMMARY OF THE INVENTION

In view of the above-described disadvantages, it is an object of the present invention to provide an electronic apparatus in which a wiring board and a connector unit are electrically connected with each other via a connection member and mounted at a case unit. The electronic apparatus is small-sized while being provided with a sufficient connection space, by restricting an interference in a connection between the wiring board and the connector unit.

According to an aspect of the present invention, an electronic apparatus has a wiring board, at least one connector unit for a connection with an external, at least one connection member for electrically connecting the wiring board with the connector unit, and a case unit at which the wiring board and the connector unit are mounted. The connector unit is arranged at a periphery of the wiring board. The connector unit has an external connection surface connected with the external and a terminal installation surface, which is substantially flat and positioned at an opposite side to the external connection surface. The connector unit has a terminal, which is installed at the terminal installation surface and connected with the connection member. The wiring board has at least one pad positioned at a first surface of the wiring board. The pad is connected with the connection member so that the pad and the terminal are electrically connected with each other via the connection member. The wiring board and the connector unit are integrally connected with each other. The wiring board and the connector unit which are integrated are mounted at the case unit, with the first surface of the wiring board and the terminal installation surface of the connector unit facing the case unit. The case unit has an installation surface at which at least one recess for accommodating therein the connection member is arranged. The wiring member and the connector unit are mounted at the installation surface.

According to another aspect of the present invention, a method is provided for manufacturing an electronic apparatus which has a wiring board and at least one connector unit positioned at a periphery of the wiring board. The wiring board and the connector unit are electrically connected with each other via a connection member and mounted at a case unit. The method includes a preparing process, an integrating process, an electrically connecting process and a mounting process. At the preparing process, the connector unit is provided with a terminal and has a terminal installation surface and an external connection surface for a connection with an external. The terminal installation surface is substantially flat and positioned at an opposite side to the external connection surface. The terminal is mounted at the terminal installation surface and connected with the connection member. Moreover, the wiring board is prepared to have at least one pad positioned at a first surface of the wiring board and connected with the connection member. Furthermore, the case unit is prepared to have at least one recess for accumulating therein the connection member. The recess is concaved from an installation surface of the case unit where the wiring board and the connector unit are mounted. At the integrating process, the wiring board and the connector unit are integrated, with the first surface of the wiring board and the terminal installation surface of the connector units facing a same direction. At the electrically connecting process, the pad is electrically connected with the terminal via the connection member. At the mounting process, the wiring board and the connector unit are mounted at the case unit, with the first surface of the wiring board and the terminal installation surface of the connector unit facing the case unit and with the connection member being arranged into the recess.

Thus, the electronic apparatus according to the present invention can be properly provided. In this case, the wiring board and the connector unit can be electrically connected with each other via the connection member. The connection member is connected to the wiring board and the connector unit having been integrated, and the connection therebetween can be performed in a state where the interference element (e.g., case unit) occurring in a conventional electronic apparatus is prevented.

Moreover, the connector unit has the external connection surface and the terminal installation surface, which is substantially flat and positioned at the opposite side to the external connection surface. Therefore, the part of the connector unit of the side of the external connection surface will not become an interference element in the connection performed at the terminal.

Furthermore, as contrary to the comparison example, according to the present invention, the pad and the terminal are respectively arranged at the surface (of wiring board) and the surface (of connector unit) which face the case unit, and the bonding wire is provided for the electrical connection among the wiring board and the connector units. Since the case unit is provided with the recess capable of housing the bonding wire, the bonding wire can be restricted from interfering with the case unit.

Therefore, in the electronic apparatus where the wiring board and the connector units are electrically connected with each other through the bonding wire and mounted at the case unit, the interference (obstruction) in the connection of the wiring board with the connector unit can be restricted. Thus, the electronic apparatus can be small-sized while a sufficient connection space can be provided.

BRIEF DESCRIPTION OF THE DRAWINGS

Other objects, features and advantages of the present invention will become more apparent from the following detailed description made with reference to the accompanying drawings, in which:

FIG. 1 is a schematic cross-sectional view showing an electronic apparatus according to a preferable embodiment of the present invention;

FIG. 3 is a schematic cross-sectional view showing a modification of the manufacture method of the electronic apparatus according to the preferable embodiment;

Figure 2A:
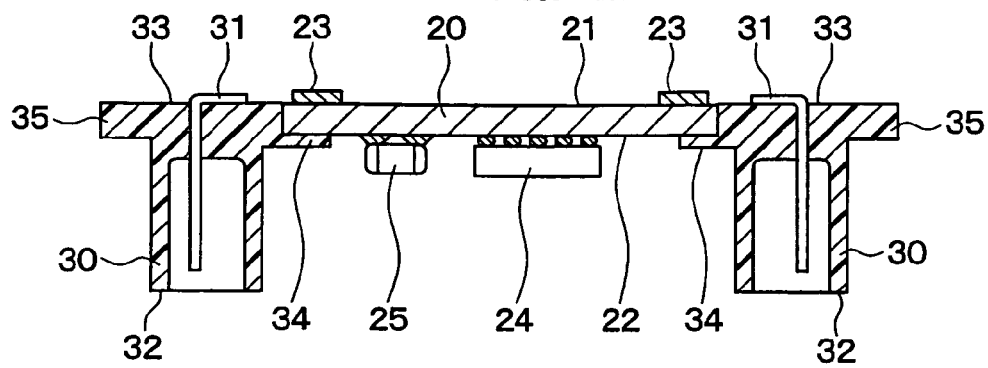
FIG. 2A is a schematic cross-sectional view showing a board-connector integrating process of a manufacture method of the electronic apparatus according to the preferable embodiment.

DETAILED DESCRIPTION OF THE EXAMPLE EMBODIMENTS (Preferable Embodiment)

An electronic apparatus 100 according to a preferable embodiment of the present invention will be described with reference to FIGS. 1–3. The electronic apparatus 100 can be suitably used for an engine ECU or the like. In this case, referring to FIG. 1, the electronic apparatus 100 can be attached to an attachment member 200 of an engine room of a vehicle, for example.

As shown in FIG. 1, the electronic apparatus 100 is mainly constructed with a wiring board 20, at least one connector unit 30 (e.g., two connector units 30 as shown in FIG. 1) through which the electronic apparatus 100 is connected with the external, at least one connection member 40 (e.g., two connection members 40 as shown in FIG. 1) for electrically connecting the wiring board 20 with the connector unit 30, and a case unit 10 at which the wiring board 20 and the connector unit 30 are mounted. In this embodiment, the connection member 40 is constructed of a bonding wire made of gold, aluminum, or the like. The connector unit 30 is arranged at the periphery of the wiring board 20.

The electronic apparatus 100 is attached to the attachment member 200, by fixing the case unit 10 to the attachment member 200 by screw units, cementing, or the like.

The case unit 10 is made of, for example, a metal such as aluminum, ferrous metal and the like. The case unit 10 has therein a space defined by a sidewall portion and an end portion (e.g., bottom portion with respect to up-down direction in FIG. 1) of the case unit 10. The case unit 10 has an opening 11, which is positioned at an opposite side (e.g., top side with respect to up-down direction in FIG. 1) of the case unit 10 to the end portion thereof. That is, the opening 11 is defined by the sidewall portion of the case unit 10. An inner surface of the end portion of the case unit 10 is used as a mounting surface 12, at which the wiring board 20 and the connector unit 30 are mounted. The wiring board 20 can be constructed of a ceramic substrate, a printed circuit board, or the like.

Referring to FIG. 1, a first surface 21 (e.g., lower surface) of the wiring board 20 is arranged to face the mounting surface 12 of the case unit 10. The wiring board 20 is fixed to the mounting surface 12 via an adhesive or the like (not shown).

At least one pad 23 (e.g., two pads) is arranged at the first surface 21 of the wiring board 20. The pad 23, being connected with the bonding wire 40 (connection member), is made of a metal such as iron, copper and the like. The pad 23 is electrically and mechanically connected with the wiring board 20 via solder, conductive adhesive, Ag paste, or the like.

Electronic components 24 and 25 (e.g., microcomputer and resistive element) are installed on a second surface 22 (i.e., upper surface) of the wiring board 20. The second surface 22 is positioned at an opposite side of the wiring board 20 to the first surface 21 thereof. The electronic components 24 and 25 can be attached to the wiring board 20 through solder, conductive adhesive, bonding wire or the like. Other electronic components, for example, an IC chip, a capacitor and the like can be also installed at the wiring board 20.

The pad 23 which is arranged at the first surface 21 of the wiring board 20 is electrically connected with a wiring part (not shown) and the electronic components 24, 25 which are arranged at the second surface 22 via an through hole (not shown). The connector unit 30 is arranged at the periphery of the wiring board 20.

The connector unit 30 is made of a resin or the like and integrated with a terminal 31 by an insertion molding, for example. The terminal 31 is made of a metal having an excellent conductivity, for example, a copper metal or the like.

An external connection surface 32 (e.g., upper end surface referring to FIG. 1) of the connector unit 30 is connected to the external. In this case, an external wiring member such as wire harness and the like is connected to the side of the external connection surface 32 (e.g., upper end surface) by engagement or the like. A terminal installation surface 33 (e.g., lower end surface referring to FIG. 1) of the connector unit 30 is substantially flat, and arranged at the opposite side to the external connection surface 32. The terminal 31 is connected with the bonding wire 40, which is used as the connection member.

In this case, the connector unit 30 is integrated with the terminal 31 which has a substantial plate or rod shape, by resin insertion-molding. The terminal 31 can have a bend shape, for example. One end of the terminal 31 is attached to (contacts) the terminal installation surface 33 of the connector unit 30. The terminal 31 extends from the terminal installation surface 33 toward the side of the external connection surface 32 of the connector unit 30, so that the other end of the terminal 31 is exposed to an opening formed at the side of the external connection surface 32. Thus, the other end of the terminal 31 is connectable with the external wiring member and the like. In this case, the terminal 31 penetrates an end portion (which has terminal installation surface 33 as bottom surface with reference to FIG. 1) of the connector unit 30, so that the two ends of the terminal 31 are respectively arranged at two sides of the end portion of the connector unit 30.

The pad 23 of the wiring board 20 and the terminal 31 of the connector unit 30 are connected with the bonding wire 40 to be electrically continuous. A board mounting portion 34 of the connector unit 30 is connected with the wiring board 20 (e.g., end portion thereof) by bonding (through silicon system adhesive or the like), or engagement fixing, or welding fixing between the connector unit 30 and the wiring board 20, or the like. Thus, the wiring board 20 and the connector units 30 are integrated.

In this case, both the first surface 21 of the wiring board 20 and the terminal installation surface 33 of the connector units 30 are arranged to face the same direction.

Figure 7:
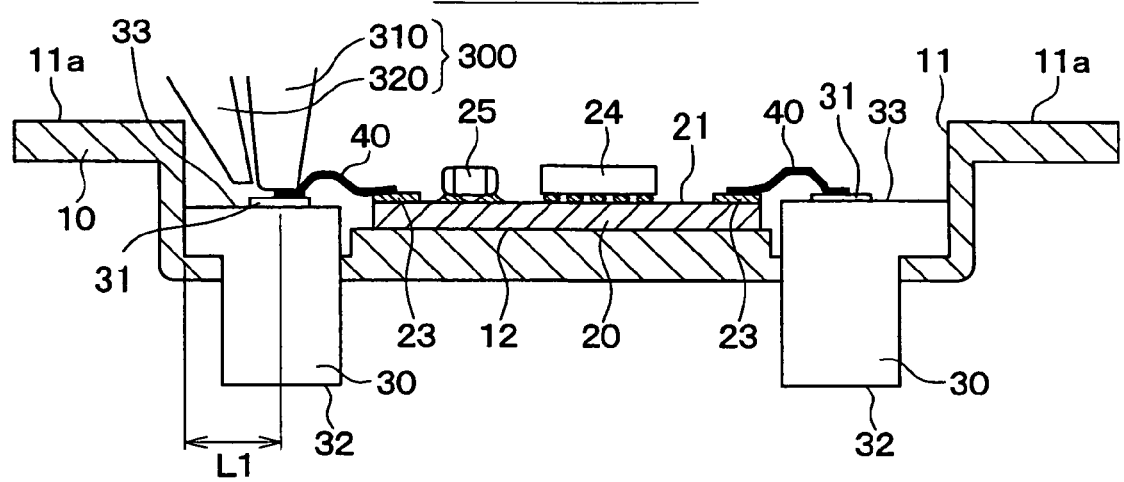
FIG. 7 is a schematic cross-sectional view showing an electronic apparatus according to a first related art.
Figure 8:
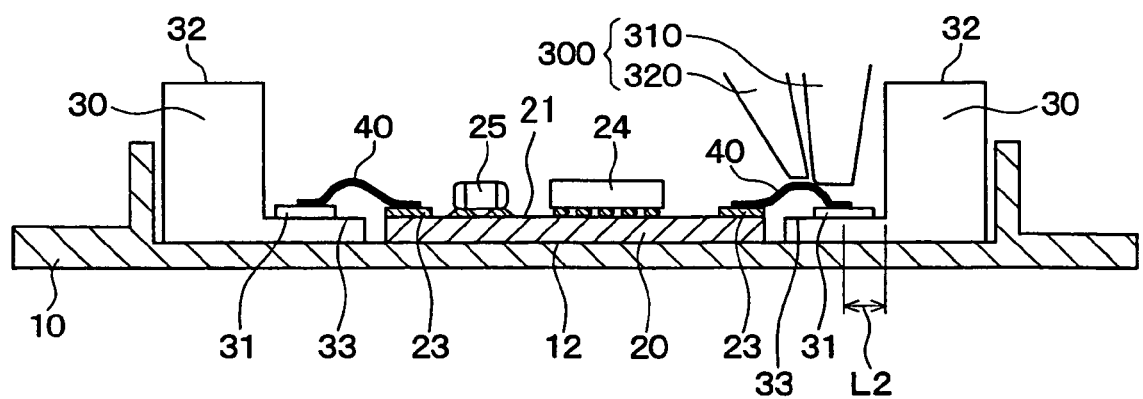
FIG. 8 is a schematic cross-sectional view showing an electronic apparatus according to a second related art.

According to this embodiment, as shown in FIG. 1, the wiring board 20 and the connector unit 30 are mounted at the case unit 10 so that both the first surface 21 and the terminal installation surface 33 face the mounting surface 12 of the case unit 10. On the other hand, according to the above-described comparison examples (referring to FIGS. 7 and 8), the first surface 21 of the wiring board 20 and the terminal installation surface 33 of the connector units 30 are arranged at an opposite side of the wiring board 20 to the mounting surface 12 of the case unit 10.

In this embodiment, the first surface 21 of the wiring board 20 and a case mounting portion 35 of the connector unit 30 are fixed to the mounting surface 12 of the case unit 10, for example, by bonding through a silicon adhesive or the like (referring to FIG. 2C which will be described later).

Furthermore, as shown in FIG. 1, the mounting surface 12 where the wiring board 20 and the connector units 30 are mounted is provided with at least one recess 13, which is dented with respect to the mounting surface 12. The bonding wire 40 (connection member) is housed in the recess 13. Therefore, the first surface 21 of the wiring board 20 contacts the mounting surface 12 except the recess 13 of the case unit 10.

Moreover, the terminal installation surface 33 of the connector unit 30 is provided with an interference-restricting protrusion portion 36, which extends into the recess 13 of the case unit 10 and protrudes to the side of the case unit 10 more than the bonding wire 40. That is, the interference-restricting protrusion portion 36 is more adjacent to the side of the attachment member 200 (where the case unit 10 is arranged) than the bonding wire 40.

The interference-restricting protrusion portion 36 is arranged to contact the case unit 10 earlier than the bonding wire 40 so that the interference between the bonding wire 40 and the case unit 10 can be restricted. The interference-restricting protrusion portion 36 has a thin pin shape or the like not to become an interfering element in a later-described wire bonding, and is arranged to keep out of a movable area of a bonder 300.

A lid portion 50 is attached to the connector unit 30, to cover the second surface 22 (i.e., upper surface) of the wiring board 20 and the electronic components 24, 25, which are mounted at the second surface 22. The lid portion 50 is made of a metal, a resin, a ceramic, or the like, and fixed to the connector unit 30 by engagement, press fit or the like.

The connector unit 30 is provided with a stopper 37 for positioning the lid portion 50. The stopper 37 is positioned between the external connection surface 32 and the terminal installation surface 33 of the connector unit 30. The lid portion 50 has at least hole which is shaped and positioned corresponding to the connector unit 30. The lid portion 50 rings the connector unit 30 from the side of the external connection surface 32 through the hole, so that the lid portion 50 is attached to the connector unit 30. That is, the hole is engaged with the connector unit 30. The lid portion 50 will be stopped by the positioning stopper 37 when contacting therewith. That is, the lip portion 50 is positioned by the positioning stopper 37.

The lid portion 50 blocks the opening 11 of the case unit 10 and protects the wiring board 20, the electronic components 24, 25, the connector units 30, the bonding wire 40 and the like inside the case unit 10. In this case, the end portion of the connector unit 30 of the side of the external connection surface 32 protrudes through the lid portion 50, so that the connector unit 30 can be connected to the external wiring member and the like through the end portion thereof.

As describe above, the electronic apparatus 100 is attached to the attachment member 200 with an intermediary of the case unit 10. In this case, the wiring board 20 and the electronic components 24, 25 mounted at the wiring board 20 are electrically communicated with the exterior via the bonding wire 40 and the connector 30.

Next, the manufacturing method of the electronic apparatus 100 according to this embodiment will be described with reference to FIGS. 2A–2C, where the interference-restricting protrusion portion 36 and the positioning stopper 37 are not shown.

At a preparing process, the connector unit 30 is prepared. The connector unit 30 is provided with the external connection surface 32 (which is to be connected to external) and the flat-shaped terminal installation surface 33 (opposite to external connection surface 32), where the terminal 31 is attached. Moreover, the wiring board 20 is prepared. The wiring board 20 is provided with the pad 23 mounted at the first surface 21 of the wiring board 20. The electronic components 24, 25 are installed at the second surface 22 of the wiring board 20. Further, the case unit 10 is prepared to have the recess 13 concaved from the mounting surface 12 thereof.

According to the comparison examples, the wire bonding is performed after the wiring board 20 and the connector unit 30 are mounted at the case unit 10. According to this embodiment, firstly, the wiring board 20 and the connector unit 30 are integrated, and the wire bonding therebetween is performed. Thereafter, the integrated unit of the wiring board 20 and the connector unit 30 is attached to the case unit 10.

That is, as shown in FIG. 2A, the wiring board 20 and the connector units 30 are integrally connected to each other, with both the first surface 21 of the wiring board 20 and the terminal installation surface 33 being directed to the same direction (board-connector integrating process).

Figure 2B:
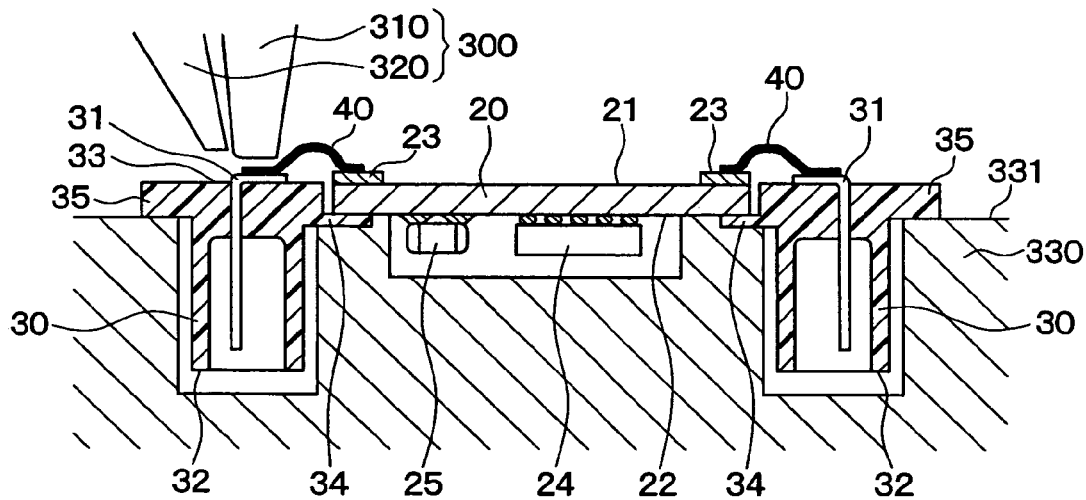
FIG. 2B is a schematic cross-sectional view showing a wire bonding process of the manufacture method.

Next, as shown in FIG. 2B, the pad 23 and the terminal 31 are electrically connected with the bonding wire 40 (wire bonding process). For the wire bonding, the integral unit of the wiring board 20 and the connector units 30 are mounted and held on a support surface 331 of a support stage 330 (used for wire bonding). The wire bonding is performed through the bonder 300 of a bonding machine.

The bonder 300 is constructed of a bonder head 310 for pressing the bonding wire 40 and a wire guide 320 for guiding the wire 40. The bonder head 310 and the wire guide 320 are integrally movable.

In this case, the bonder 300 is positioned at the upper side of the bonding surface of the pad 23 of the wiring board 20, and the first bonding is performed thereat. Thereafter, the bonder 300 is moved to the upper side of the terminal 31 of the connector unit 30 to route the wire 40, and the second bonding is performed thereat. Then, the bonder 300 is made step back to cut the wire 40.

Alternatively, the first bonding can be also performed at the side of the terminal 31, and the second bonding can be also performed at the side of the pad 23. In the wire bonding, because neither the case unit 10 nor the connector unit 30 exists as an interfering element, the bonder 300 will not be obstructed.

Figure 2C:
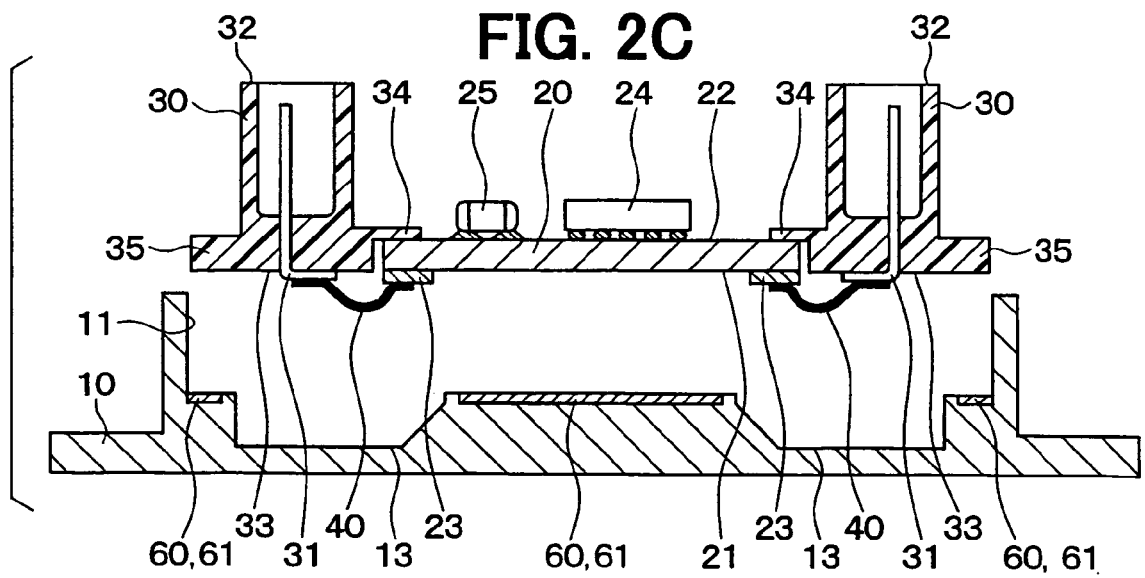
FIG. 2C is a schematic cross-sectional view showing a case mounting process of the manufacture method.

After the performing of the wire bonding, as shown in FIG. 2C, the wiring board 20 and the connector unit 30 are mounted at the case unit 10, with both the first surface 21 (of wiring board 20) and the terminal installation surface 33 (of connector units 30) facing to the case unit 10 and with the bonding wire 40 being arranged into the recess 13 (case mounting process).

In this case, as shown in FIG. 2C, the mounting surface 12 of the case unit 10 is provided with an adhesive 60 applied to a position where the first surface 21 of the wiring board 20 is to contact the mounting surface 12, and a position where the case mounting portion 35 of the connector unit 30 is to contact the mounting surface 12.

The adhesive 60 is arranged in an adhesive reservoir portion 61. The adhesive reservoir portion 61 is a slot and provided at the position of the mounting surface 12 where the adhesive 60 is applied. The depth of the adhesive reservoir portion 61 is set, for example, in a substantial range from 0.1 mm to 0.5 mm, and preferably set as 0.2 mm or so.

After the wiring board 20 and the connector unit 30 are mounted at the case unit 10 with the adhesive 60 therebetween, the adhesive 60 is heated and hardened. Thus, the wiring board 20 and the connector units 30 are fixed to the case unit 10 by bonding. Thereafter, the lid portion 50 is attached to the connector unit 30. Thus, the manufacture of the electronic apparatus 100 shown in FIG. 1 is completed.

Alternatively, as shown in FIG. 3, the attachment of the lid portion 50 can be also performed before the wiring board 20 and the connector units 30 are attached to the case unit 10.

According to this embodiment, the electronic apparatus 100 is provided with the wiring board 20, the connector unit 30 which is arranged at the periphery of the wiring board 20 for the external connection, the bonding wire 40 which is used as the connection member for electrically connecting the wiring board 20 with the connector unit 30, and the case unit 10 where the wiring board 20 and the connector units 30 are mounted. Next, the characteristics of the electronic apparatus 100 will be described.

The connector unit 30 is constructed to have the terminal installation surface 33 which is substantially flat and opposite to the external connection surface 32. The terminal 31, to which the bonding wire 40 is connected, is attached to the terminal installation surface 33.

The pad 23 which is connected with the bonding wire 40 is arranged at the first surface 21 of the wiring board 20. The pad 23 and the terminal 31 are electrically connected with each other via the bonding wire 40.

The wiring board 20 and the connector unit 30 are integrally connected with each other. The wiring board 20 and the connector unit 30 which are integrated is mounted at the case unit 10, with both the first surface 21 of the wiring board 20 and the terminal installation surface 33 of the connector unit 30 facing the case unit 10.

The recess 13 for accumulating the bonding wire 40 is arranged at the mounting surface 12 which is provided for the mounting of the wiring board 20 and the connector units 30.

According to this embodiment, the above-described manufacturing method is provided for the electronic apparatus 100, in which the connector unit 30 is arranged at the periphery of the wiring board 20, the wiring board 20 and the connector unit 30 are electrically connected with each other via the bonding wire 40 (as connection member), and the wiring board 20 and the connector unit 30 are mounted at the case unit 10.

The manufacturing method of the electronic apparatus 100 includes the preparing process, the integrating process, an electrically connecting process (e.g., wire bonding process), and the mounting process.

At the preparing process, what is prepared as the connector unit 30 is provided with the terminal installation surface 33 which is substantially flat and opposite to the external connection surface 32 (which can be connected to external), and the terminal 31 where the bonding wire 40 is connected is attached to the terminal installation surface 33. Moreover, what is prepared as the wiring board 20 is provided with the pad 23 which is positioned at the first surface 21 and connected with the bonding wire 40. Furthermore, what is prepared as the case unit 10 is provided with the recess 13, which is capable of accumulating the bonding wire 40 and formed at the mounting surface 12 for the wiring board 20 and the connector unit 30.

At the integrating process, the wiring board 20 and the connector unit 30 are integrally connected with each other, with the first surface 21 of the wiring board 20 and the terminal installation surface 33 of the connector units 30 facing the same direction.

At the electrically connecting process, the pad 23 and the terminal 31 are electrically connected with each other via the bonding wire 40, in the integral unit of the wiring board 20 and the connector unit 30.

At the mounting process, the wiring board 20 and the connector unit 30 are mounted at the case unit 10, with both the first surface 21 of the wiring board 20 and the terminal installation surface 33 of the connector units 30 facing the case unit 10 and with the bonding wire 40 being arranged into the recess 13.

According to the manufacturing method of this embodiment, the electronic apparatus 100 having the above-described characteristics can be manufactured properly.

Thus, according to the electronic apparatus 100 which can be manufactured by this manufacturing method, the electrical connection among the multiple connector units 30 and the electrical connection between the connector unit 30 and the wiring board 20 can be performed by the bonding wire 40 positioned between the connector unit 30 and the wiring board 20 which are integrated. In the electrical connection, the case unit 10 will not become an interfering element. That will occur in the comparison example.

Moreover, because the connector unit 30 is provided with the terminal installation surface 33 which is substantially flat and opposite to the external connection surface 32 connected to the external, the part of the connector unit 30 of the side of the external connection surface 32 will not become an interfering element.

Moreover, in this embodiment, as contrary to the comparison example, the pad 23 and the terminal 31 are respectively arranged at the surface 21 (of wiring board 20) and the surface 33 (of connector unit 30) which face the case unit 10, and the bonding wire 40 is provided for the electrical connection among the wiring board 20 and the connector units 30. Since the case unit 10 is provided with the recess 13 capable of housing the bonding wire 40, the bonding wire 40 can be restricted from interfering with the case unit 10.

Thus, according to the electronic apparatus 100 and the manufacturing method thereof of this embodiment, the wiring board 20 and the connector units 30 are electrically connected with each other through the bonding wire 40, and mounted at the case unit 10. Therefore, the interference (obstruction) in the connection of the wiring board 20 with the connector unit 30 can be restricted. Thus, the electronic apparatus 100 can be small-sized while a sufficient connection space can be ensured.

Moreover, according to this embodiment, the electronic apparatus 100 is provided with the interference-restricting protrusion portion 36 which protrudes from the terminal installation surface 33 into the recess 13 of the case unit 10 so that the tip thereof is more adjacent to the side of the case unit 10 than the bonding wire 40. Therefore, the interference between the bonding wire 40 and the case unit 10 is restricted by the interference-restricting protrusion portion 36.

Thus, the deformation and the short circuit of the bonding wire 40 due to the interference (contact) with the case unit 10 can be restricted, in the case where the wiring board 20 and the connector unit 30 are mounted at the case unit 10 with the bonding wire 40 being arranged into the recess 13.

Furthermore, in the electronic apparatus 100 according to this embodiment, the electronic components 24, 25 are mounted on the other surface 22 which is positioned at the opposite side of the wiring board 20 to the first surface 21, and the first surface 21 of the wiring board 20 contacts the part of the case unit 10 other than the recess 13 arranged thereat.

Accordingly, heat generated by the electronic components 24, 25 can be radiated from the wiring board 20 through the case unit 10. Thus, the heat radiation performance is improved.

Figure 4:
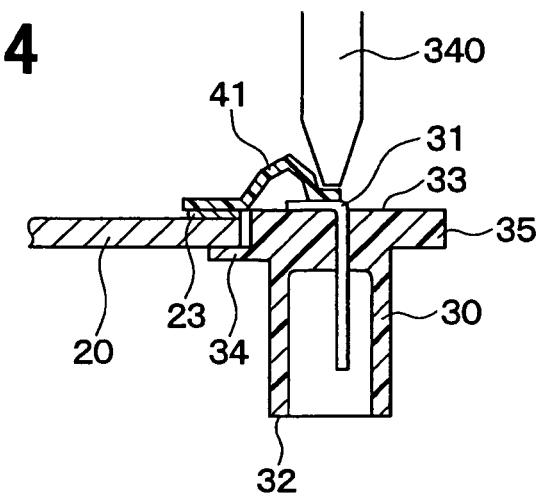
FIG. 4 is a schematic cross-sectional view showing a first modification according to the preferable embodiment.

FIG. 4 shows a first modification of the preferable embodiment. As shown in FIG. 4, a flexible printed circuit board 41 is used as the connection member for electrically connecting the pad 23 of the wiring board 20 and the terminal 31 of the connector unit 30, to be substituted for the bonding wire 40 (referring to FIG. 1).

According to the first modification, the connection process via the flexible printed circuit board 41 is performed after the board-connector integrating process.

In the connection process, the flexible printed circuit board 41 is made contact the pad 23 and the terminal 31, and pressed thereto by a heating/pressing jig 340. Thus, the pad 23 and the terminal 31 are electrically connected with each other through the flexible printed circuit board 41. In this case, neither the case unit 10 nor the connector units 30 exist as an interfering element. Therefore, the interference with the heating/pressuring jig 340 can be prevented.

Thereafter, similarly to what is described above in the preferable embodiment, the wiring board 20 and the connector units 30 are mounted at the case unit 10, with both the first surface 21 (of wiring board 20) and the terminal installation surface 33 (of connector units 30) facing to the case unit 10 and with the bonding wire 40 being arranged into the recess 13. Thereafter, the lid portion 50 is attached to the connector unit 30. Thus, the manufacture of the electronic apparatus 100 is completed.

Figure 5:
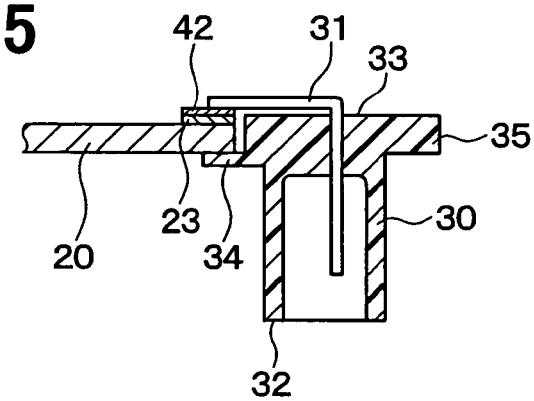
FIG. 5 is a schematic cross-sectional view showing a second modification according to the preferable embodiment.

According to a second modification of the preferable embodiment, referring to FIG. 5, the pad 23 of the wiring board 20 and the terminal 31 of the connector unit 30 are connected with each other by soldering through a solder 42, instead of the bonding wire 40 (referring to FIG. 1).

Figure 6:
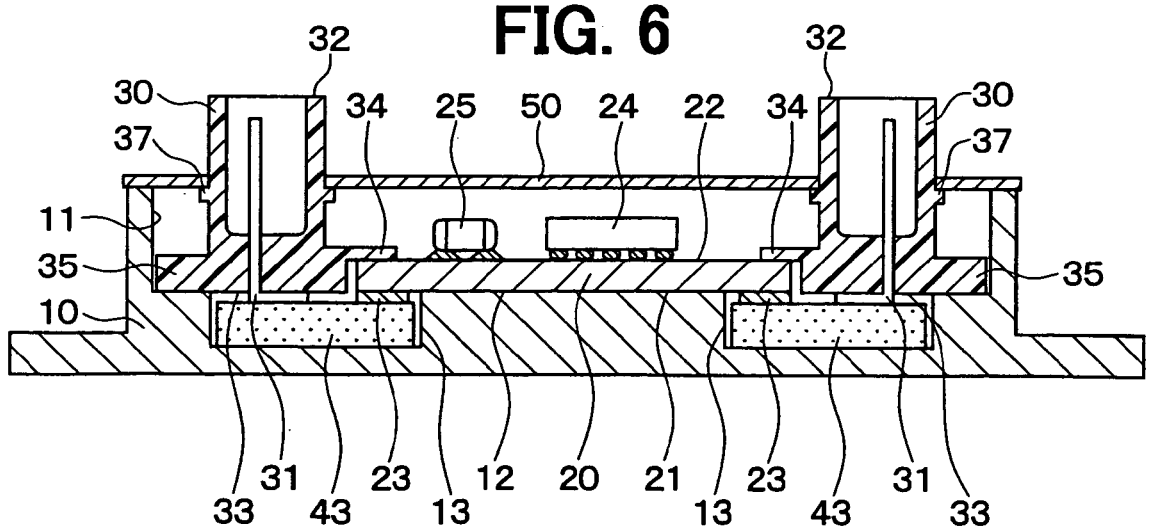
FIG. 6 is a schematic cross-sectional view showing a third modification according to the preferable embodiment.

According to a third modification of the preferable embodiment, referring to FIG. 6, the pad 23 of the wiring board 20 and the terminal 31 of the connector unit 30 are connected with each other via a press-contacting connector 43, instead of the bonding wire 40 (referring to FIG. 1).

In this case, the connector unit 30 and the wiring board 20, which are integrated, are attached to the case unit 10, where the press-contacting connector 43 has been disposed in the recess 13 of the case unit 10. Thus, the fixing of the wiring board 20 and the connector units 30 to the case unit 10 and the connection of the press-contacting connector 43 with the pad 23 and the terminal 31 can be performed simultaneously.

(Other Embodiments)

Although the present invention has been fully described in connection with the preferred embodiments thereof with reference to the accompanying drawings, it is to be noted that various changes and modifications will become apparent to those skilled in the art.

As described above, the electronic components 24, 25 are installed at the second surface 22 of the wiring board 20. However, the electronic components 24, 25 can be also installed at the first surface 21 (of wiring board 20) which faces the case unit 10. In this case, a recess or the like is arranged at the mounting surface 12 (which faces electronic components 24, 25) to accumulate the electronic components 24, 25, so that the electronic components 24, 25 do not interfere with the case unit 10.

The lid portion 50 can be also omitted when being unnecessary.

Moreover, the wiring board 20 may be arbitrary as long as the pad 23 is provided at the first surface 21 facing the case unit 10, and may be not provided with the electronic components installed thereat. Furthermore, the electronic components of the present invention are not limited to those of the illustrated examples.

Furthermore, the connector unit 30 is not limited to that of the above-mentioned illustrated example, as long as the connector unit 30 is constructed in such a way that the terminal installation surface 33 having the substantially flat shape is at the opposite side of the connector unit 30 to the external connection surface 32 and the terminal 31 is provided at the terminal installation surface 33. Moreover, the shape of the case unit 10 is not limited to that of the above-mentioned illustrated example.

The electronic apparatus 100 of the present invention has significant constructions including: that the wiring board 20 and the connector units 30 are integrated and attached to face the case unit 10, that the pad 23 and the terminal 31 which are respectively arranged at the surfaces 21 and 33 (of wiring board 20 and terminal 31) facing the case unit 10 are connected with each other through the connection member 40, and that the case unit 10 is provided with the recess 13 capable of accumulating therein the connection member 40, 41, 42 or 43. The parts of the electronic apparatus other than the significant constructions can be provided with an appropriate design alteration.

Such changes and modifications are to be understood as being in the scope of the present invention as defined by the appended claims.

What is claimed is:

1. An electronic apparatus comprising:
  a wiring board;
  at least one connector unit for a connection with an external, the connector unit being arranged at a periphery of the wiring board;
  at least one connection member for electrically connecting the wiring board with the connector unit; and
  a case unit having an installation surface at which the wiring board and the connector unit are mounted, wherein:
  the connector unit has an external connection surface connected with the external and a terminal installation surface, which is substantially flat and positioned at an opposite side to the external connection surface;
  the connector unit has a terminal, which is installed at the terminal installation surface and connected with the connection member;
  the wiring board has at least one pad positioned at a first surface of the wiring board, the pad being connected with the connection member so that the pad and the terminal are electrically connected with each other via the connection member;

the wiring board and the connector unit are integrally connected with each other;

the wiring board and the connector unit which are integrated are mounted at the case unit, with both the first surface of the wiring board and the terminal installation surface of the connector unit facing the installation surface of the case unit; and the installation surface of the case unit has at least one recess in which the connection member is accommodated.

2. The electronic apparatus according to claim 1, wherein the connection member is a bonding wire.

3. The electronic apparatus according to claim 1, wherein the connection member is a flexible printed circuit board.

4. The electronic apparatus according to claim 1, wherein the connector unit has an interference-restricting protrusion portion for restricting the connection member from interfering with the case unit, the interference-restricting protrusion portion protruding from the terminal installation surface into the recess of the case, to be more adjacent to a side of the case unit than the connection member.

5. The electronic apparatus according to claim 1, wherein:

the wiring board has a second surface at which at least one electronic component is mounted, the second surface being at an opposite side of the wiring board to the first surface; and the first surface of the wiring board contacts the case unit other than the recess.

6. The electronic apparatus according to claim 1, wherein the terminal has a bend shape so that one end thereof contacts the terminal installation surface.

7. The electronic apparatus according to claim 1, wherein:

at least one electronic component is mounted at the first surface; and the installation surface of the case unit has a concave portion for accumulating the electronic component.

8. The electronic apparatus according to claim 2, wherein:

the wiring board has a second surface at which at least one electronic component is mounted, the second surface being at an opposite side of the wiring board to the first surface; and the first surface of the wiring board contacts the case unit other than the recess.

9. The electronic apparatus according to claim 3, wherein:

the wiring board has a second surface at which at least one electronic component is mounted, the second surface being at an opposite side of the wiring board to the first surface; and the first surface of the wiring board contacts the case unit other than the recess.

10. The electronic apparatus according to claim 4, wherein:

the wiring board has a second surface at which at least one electronic component is mounted, the second surface being at an opposite side of the wiring board to the first surface; and the first surface of the wiring board contacts the case unit other than the recess.

11. A method for manufacturing an electronic apparatus which has a wiring board and at least one connector unit positioned at a periphery of the wiring board, the wiring board and the connector unit being electrically connected with each other via a connection member and being mounted at an installation surface of a case unit, the method comprising:

preparing the connector unit, which has a terminal and is provided with a terminal installation surface and an external connection surface for a connection with an external, the terminal installation surface being substantially flat and being positioned at an opposite side to the external connection surface, the terminal being mounted at the terminal installation surface and being connected with the connection member;

preparing the wiring board, which has at least one pad positioned at a first surface of the wiring board and connected with the connection member;

preparing the case unit, which has at least one recess for accumulating therein the connection member, the recess being concaved from the installation surface of the case unit;

integrating the wiring board with the connector unit, with the first surface of the wiring board and the terminal installation surface of the connector unit facing a same direction;

electrically connecting the pad with the terminal via the connection member; and mounting the wiring board and the connector unit at the case unit with the first surface of the wiring board and the terminal installation surface of the connector unit facing the installation surface of the case unit and with the connection member being arranged into the recess.

12. The method for manufacturing the electronic apparatus according to claim 11, wherein the connection member is a bonding wire.

13. The method for manufacturing the electronic apparatus according to claim 11, wherein the connection member is a flexible printed circuit board.

14. The method for manufacturing the electronic apparatus according to claim 11, wherein the terminal has a bend shape so that one end thereof contacts the terminal installation surface.

* * * * *